(12) United States Patent
Li et al.

(10) Patent No.: US 10,310,035 B2
(45) Date of Patent: Jun. 4, 2019

(54) BODY COIL AND MAGNETIC RESONANCE IMAGING SYSTEM

(71) Applicant: Siemens Healthcare GmbH, Erlangen (DE)

(72) Inventors: Wen Ming Li, Shenzhen (CN); Tong Tong, Shenzhen (CN); Markus Vester, Nuremberg (DE); JianMin Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 95 days.

(21) Appl. No.: 15/337,045

(22) Filed: Oct. 28, 2016

(65) Prior Publication Data

US 2017/0123024 A1 May 4, 2017

(30) Foreign Application Priority Data

Oct. 28, 2015 (CN) .......................... 2015 1 0713083

(51) Int. Cl.
  *G01V 3/00* (2006.01)
  *G01R 33/36* (2006.01)
  *G01R 33/34* (2006.01)

(52) U.S. Cl.
  CPC ... *G01R 33/3628* (2013.01); *G01R 33/34046* (2013.01); *G01R 33/34076* (2013.01); *G01R 33/3657* (2013.01)

(58) Field of Classification Search
  CPC .......... G01R 33/3657; G01R 33/34046; G01R 33/341; G01R 33/3415; G01R 33/365; G01R 33/36654; G01R 33/3692; G01R 33/38

USPC ......................................... 324/322
See application file for complete search history.

(56) References Cited

U.S. PATENT DOCUMENTS

| | | | | |
|---|---|---|---|---|
| 2005/0127914 A1* | 6/2005 | Eberler | ............ | G01R 33/34046 324/318 |
| 2012/0313645 A1* | 12/2012 | Biber | ................. | G01R 33/3692 324/322 |
| 2014/0312902 A1* | 10/2014 | Tan | .................... | G01R 33/3657 324/322 |
| 2015/0022208 A1* | 1/2015 | Biber | ................. | G01R 33/3664 324/309 |

* cited by examiner

*Primary Examiner* — Rodney E Fuller
(74) *Attorney, Agent, or Firm* — Schiff Hardin LLP

(57) ABSTRACT

A body coil for an MRI system has a conductor management and a tuning/detuning circuit. The tuning/detuning circuit is connected to the conductor management, and used to subject the conductor management to tuning/detuning control by a control signal. The tuning/detuning circuit has a control signal interface, a switch diode unit and an AC/DC conversion circuit. The control signal interface receives the control signal. There is at least one switch diode unit, respectively series-connected on at least one antenna rod and/or at least one end ring of the body coil conductor management. The AC/DC conversion circuit has a rectifying circuit, for converting the power of an input RF emission signal in the MRI system to a DC current, the DC current being used to provide a DC current for the switch diode unit to be turned on. The body coil reduces the cost of a DC power supply, and this reduces heat generated by the diodes.

9 Claims, 6 Drawing Sheets

BODY COIL AND MAGNETIC RESONANCE IMAGING SYSTEM

BACKGROUND OF THE INVENTION

Field of the Invention

The present invention relates to the field of magnetic resonance imaging, in particular to a body coil for a magnetic resonance imaging apparatus, and a magnetic resonance imaging apparatus having such a body coil.

Description of the Prior Art

Magnetic resonance imaging (MRI) is a modality in which the phenomenon of magnetic resonance is used to perform imaging. MRI systems generally have a superconducting magnet forming a patient receptacle, gradient coils arranged inside the superconducting magnet encircling the receptacle, a body coil located inside the gradient coils and also encircling the receptacle, an examination table on which a patient is placed, and a local coil for covering a particular part of the patient. The body coil may serve as both a transmitting coil and a receiving coil; the local coil chiefly serves as a receiving coil. The superconducting magnet provides a uniform basic magnetic field B0 in the axial direction of the magnet. The basic magnetic field B0 is static and has a high field strength. When the body coil is used as a transmitting coil, it transmits radio frequency (RF) signals, and produces a magnetic field B1 that is perpendicular to magnetic field B0. The magnetic field B1 has a lower field strength than B0, and is generated only during operation. The B1 field is an oscillating field, rotating with a frequency γ*B0. The frequency is about 64 MHz when B0 is 1.5 T. Once excited, hydrogen atoms in water molecules in the body are deflected, then return to the "base state" while emitting an RF signal called a magnetic resonance signal. A receiving coil receives this signal by induction. In order to distinguish between the positions of different hydrogen atoms in space, the gradient coils generate gradient magnetic fields of different strengths in three spatial directions, such that the strength of the magnetic field at any point in space is unique. By subjecting a signal received by the receiving coil to calculations based on the gradient magnetic fields, a signal for a corresponding position is obtained.

A birdcage coil is a commonly used type of body coil. A birdcage coil is formed by end rings at opposite ends and multiple rods therebetween, and may be one of three types, namely high-pass, low-pass and band-pass. Depending on the type of body coil, a frequency tuning capacitor will be incorporated on the two end rings and the antenna rods. For instance, the frequency tuning capacitors of a low-pass birdcage coil are located in the middle of each rod, while the frequency tuning capacitors of a high-pass birdcage coil are located on metal rings at the two ends. In the case of a band-pass birdcage coil, the frequency tuning capacitors may be located on both the rods and the end rings. In general, one or more switch diodes, such as a PIN diode, is/are series-connected on each rod, or on some of the rods, and/or on the end rings of a birdcage coil, to serve as a body coil switch. When the MRI system emits an RF signal, the PIN diode is powered by a forward current, so the PIN diode is conducting, and the body coil is tuned. When the MRI system receives an RF signal, the PIN diode of the body coil is reverse biased, so the PIN diode is non-conducting, and the body coil is detuned.

FIG. 1 is a schematic illustration of a known existing body coil. As FIG. 1 shows, the body coil is a high-pass birdcage quadrature coil. The birdcage coil has 16 rods, with one PIN diode series-connected on each rod. When the MRI system emits an RF signal, the 16 PIN diodes need a total current of 4.8 A as a power supply, with an average of 300 mA allocated to each PIN diode, so that the PIN diodes are conducting, and the body coil is tuned. When the MRI system receives an RF signal, each PIN diode is powered by a reverse voltage of −31 V, so that the PIN diodes are non-conducting, and the body coil is detuned.

Although body coil tuning/detuning schemes commonly used at present are problem-free in terms of function, and widely applied, the high power supply current of the PIN diodes makes the cost of the DC power supply high. Moreover, when the body coil is in a tuned state, despite the fact that sometimes no RF energy is emitted or only a very small amount of RF energy is emitted, it is still necessary to continuously supply a DC current of 4.8, which results in an unnecessary DC loss, and is likely to cause the problem of the PIN diodes generating heat.

SUMMARY OF THE INVENTION

An object of the present invention is to provide a body coil, and furthermore a magnetic resonance system, wherein the cost of the DC power supply is lowered, and consequently the problem of PIN diodes generating heat is addressed.

The body coil for a magnetic resonance imaging (MRI) system in accordance with the present invention has a conductor arrangement and a tuning/detuning circuit.

The conductor arrangement two end rings and multiple uniformly distributed antenna rods connected between the two end rings.

The tuning/detuning circuit is connected to the conductor management, and tunes and detunes the conductor arrangement on the basis of a control signal. The tuning/detuning circuit has a control signal interface, a switch diode unit, and an AC/DC conversion circuit.

The control signal interface is receives a control signal in the form of a DC current signal.

There is at least one said switch diode unit, each series-connected on at least one antenna rod and/or at least one end ring of the body coil conductor management. Each switch diode unit is formed of at least one switch diode connected in series and/or in parallel.

The AC/DC conversion circuit has a rectifying circuit, for converting the power of an input RF emission signal in the MRI system to a DC current.

The DC current signal of the control signal and the DC current of the AC/DC conversion circuit turn on the switch diode unit (i.e., make it conducting).

In an embodiment, the number of the AC/DC conversion circuit(s) is the same as the number of switch diode unit(s), each AC/DC conversion circuit being used to provide a DC current for one switch diode unit to be turned on.

In another embodiment, each AC/DC conversion circuit further has a first shunt inductor connected in series with the rectifying circuit;

The tuning/detuning circuit further has at least one second shunt inductor corresponding to the number of switch diode unit(s), each second shunt inductor being connected in series with one switch diode unit, on an antenna rod or end ring of the body coil conductor management, to form a switch unit on the antenna rod or end ring;

Two ends of each AC/DC conversion circuit are connected to two ends of one switch unit, respectively.

The first shunt inductor and the second shunt inductor are used to shunt the input RF emission signal in the MRI system, on the switch diode unit and the rectifying circuit.

The control signal interface is connected to a positive terminal of the switch diode unit, or connected to the second shunt inductor.

In another embodiment, the tuning/detuning circuit further comprises a control circuit or control circuits corresponding to the number of switch diode unit(s), each control circuit being connected in series with one switch diode unit or connected in series with one rectifying circuit. The control signal is a DC voltage signal and the control circuit is used for turning off the rectifying circuit and switch diode unit when the control signal is a DC voltage signal.

In another embodiment, each control circuit has a bipolar junction transistor connected in series with the switch diode unit or with the rectifying circuit, and a bypass diode connected between the base and collector, or the base and emitter, of the bipolar junction transistor; and at least two AC passthrough capacitors connected in parallel between the various pins of the bipolar junction transistor.

In another embodiment, there is one such AC/DC conversion circuit, connected in parallel with any one switch diode unit; the remaining switch diode unit(s) and the switch diode unit connected to the AC/DC conversion circuit are connected in parallel, each via an RF choke inductor.

In an embodiment, the AC/DC conversion circuit further has a first shunt inductor connected in series with the rectifying circuit.

The tuning/detuning circuit further has a second shunt inductor which is connected in series with the switch diode unit connected to the AC/DC conversion circuit, on a corresponding antenna rod or end ring, to form a switch unit on the antenna rod or end ring.

Two ends of the AC/DC conversion circuit are connected to two ends of the switch unit, respectively;

The first shunt inductor and the second shunt inductor are used to shunt the input RF emission signal in the MRI system, on the switch diode unit and the rectifying circuit.

The control signal interface is connected to a positive terminal of the switch diode unit connected to the AC/DC conversion circuit, or connected to the second shunt inductor.

In another embodiment, the tuning/detuning circuit further has a control circuit connected in series with the switch diode unit or connected in series with the rectifying circuit. The control signal also is a DC voltage signal and the control circuit turns off the rectifying circuit and switch diode unit when the control signal is a DC voltage signal.

In one embodiment, the control circuit has a bipolar junction transistor connected in series with the switch diode unit or with the rectifying circuit, and a bypass diode connected between the base and collector, or the base and emitter, of the bipolar junction transistor; and at least two AC passthrough capacitors connected in parallel between the various pins of the bipolar junction transistor.

The MRI system provided in the present invention has a body coil in any one of the forms described above.

Since the tuning/detuning circuit in embodiments of the present invention replaces a large tuning control current with a small tuning control current, while making use of an AC/DC conversion circuit capable of converting the power of an input RF emission signal to DC, an additional DC current is supplied to the switch diode when the MRI system emits an RF signal. Not only is it possible to ensure that the DC current flowing through the switch diode is larger when the body coil emits an RF signal, and to lower the RF loss, but also the cost of the DC power supply is lowered, and the switch diodes generate less heat.

In addition, by providing shunt inductors for the AC/DC conversion circuit and switch diode, it is possible to control the input RF emission signal component used for conversion to DC in the AC/DC conversion circuit, and the shunt inductors do not affect the transmission of the input RF emission signal. Thus the stability of the tuning/detuning circuit is more assured. Moreover, the larger the input RF emission signal, the larger the DC generated, and the shunt inductor can avoid the problem of the switch diode generating heat caused by an unnecessary large DC current when the signal is small.

In addition, by providing only one AC/DC conversion circuit, and connecting all the switch diode units in parallel via RF choke inductors, not only can DC parallel connection in the tuning/detuning circuit be realized, but also the transmission of AC generated by the RF signal is not affected, i.e. normal operation of the body coil conductor management is not affected; at the same time, the number of components in the tuning/detuning circuit can be reduced, further reducing costs.

In addition, since a DC voltage signal of 0 V may also be used as the control signal in an embodiment of the present invention, the circuit structure can be further simplified, and the cost of the DC power supply can be reduced, while simplifying switching of the control signal.

BRIEF DESCRIPTION OF THE DRAWINGS

FIGS. 2A and 2B are schematic illustrations of a body coil in a first embodiment of the present invention wherein FIG. 2B is a schematic illustration of a general control signal interface shared by the tuning/detuning circuit in FIG. 2A.

DESCRIPTION OF THE PREFERRED EMBODIMENTS

Figure 1:
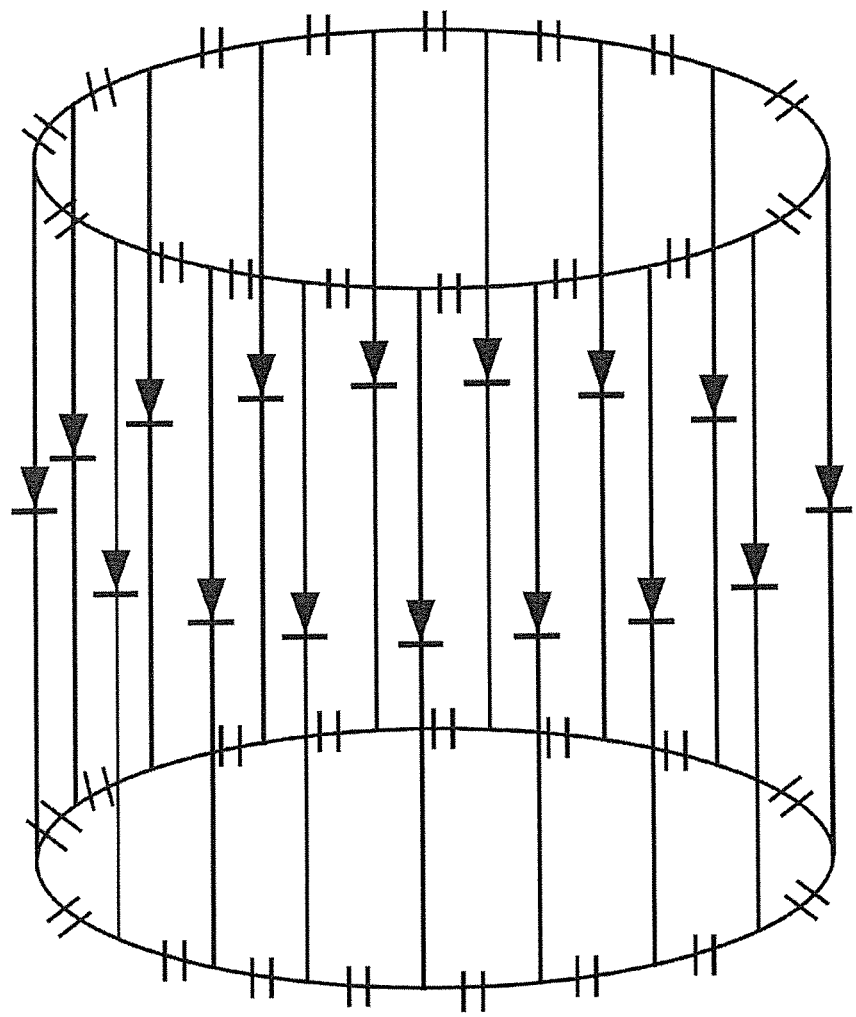
FIG. 1 schematically illustrates an existing body coil.

In an embodiment of the present invention, in order to lower the cost of the DC power supply, and solve the problem of switch diodes generating heat, a smaller tuning control current is supplied continuously to the switch diode only while ensuring that the voltage across the switch diode of the body coil can turn on the switch diode, and at the same time an AC/DC conversion circuit capable of converting the power of an input RF emission signal to DC is provided, in order to supply an additional DC current to the switch diode when the MRI system emits an RF signal, i.e. when an electromagnetic wave is generated. Not only is it possible to ensure that the DC current flowing through the switch diode is larger when the body coil emits an RF signal, and lower the RF loss, but it is also possible to lower the cost of the DC power supply. Moreover, the larger the input RF emission signal, the larger the DC power generated, and the problem of switch diodes generating heat, caused by too large a DC supply current when the signal is small or when there is no signal, is avoided.

The body coil in various embodiments of the present invention has a body coil conductor management and a tuning/detuning circuit. The body coil conductor management has two end rings and multiple uniformly distributed antenna rods connected between the two end rings, as well as multiple frequency tuning capacitors disposed on the end rings and/or the antenna rods. The tuning/detuning circuit is connected to the body coil conductor management, and used to subject the body coil conductor management to switch control, i.e. tuning/detuning control, on the basis of a control signal. The tuning/detuning circuit comprises a control signal interface, a switch diode unit and an AC/DC conversion circuit. The control signal interface is used to receive the control signal; the control signal is a DC current signal and a DC voltage signal (which in some embodiments may also be a DC voltage signal of 0 V) which alternate with one another. There is at least one said switch diode unit, respectively series-connected on at least one antenna rod and/or at least one end ring of the body coil conductor management, each switch diode unit being formed of at least one switch diode connected in series and/or in parallel; when the switch diode unit is turned on, the body coil conductor management is tuned; when the switch diode unit is turned off, the body coil conductor management is detuned. The AC/DC conversion circuit has a rectifying circuit, for converting the power of an input RF emission signal in the MRI system to a DC current, the DC current being used to provide a DC current for the switch diode unit to be turned on. The DC current signal of the control signal and the DC current of the AC/DC conversion circuit turn on the switch diode unit; or the DC voltage signal of the control signal turns off the switch diode unit.

In order to describe the object, technical solution and advantages of the present invention, the present invention is explained in further detail below in a number of embodiments.

Embodiment 1

Figure 2A:
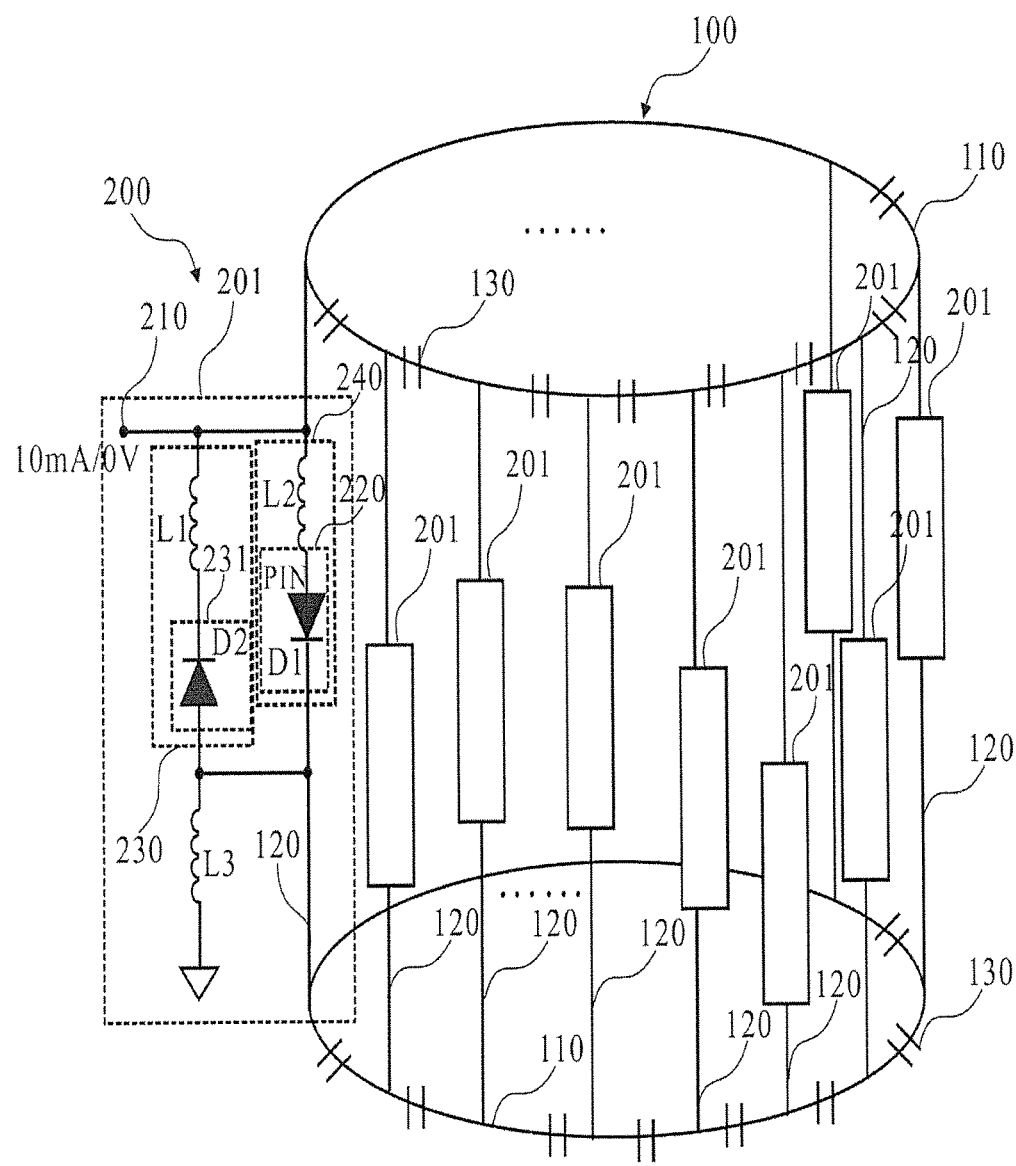
Figure 2B:
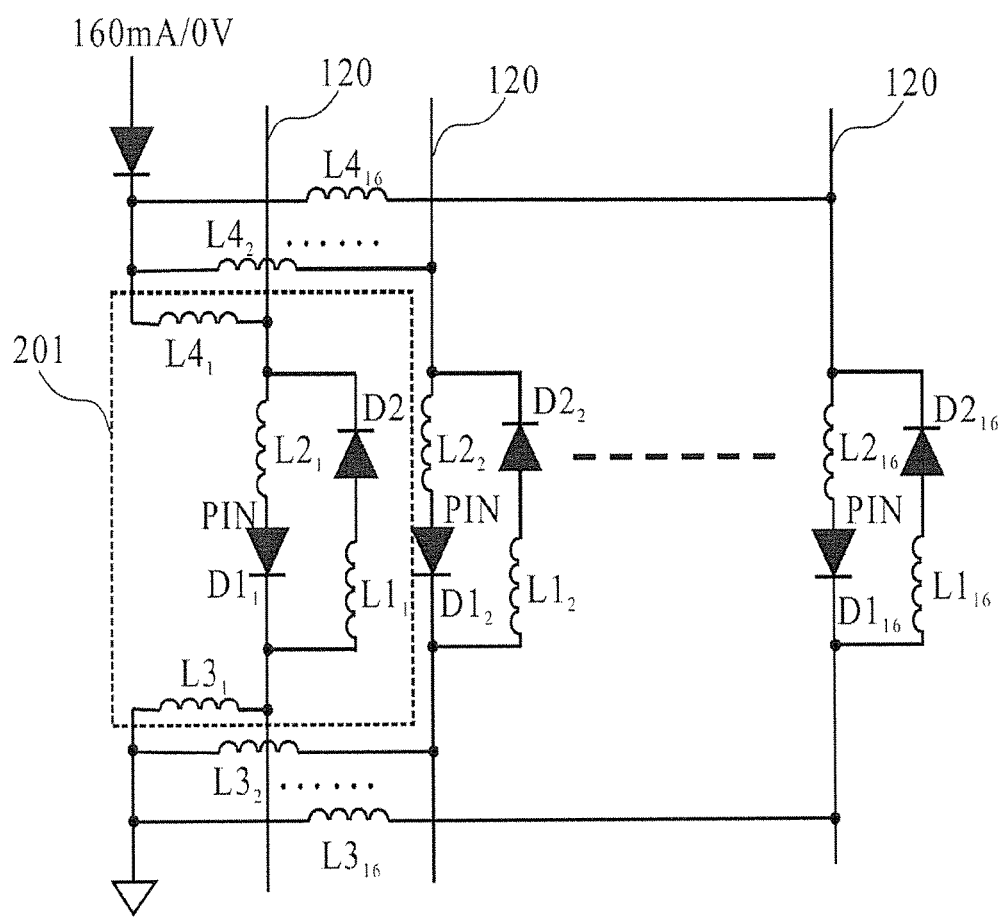

FIGS. 2A and 2B are schematic diagrams of a body coil in embodiment 1 of the present invention. FIG. 2B is a structural schematic diagram of a general control signal interface shared by the tuning/detuning circuit 200 in FIG. 2A.

As FIG. 2A shows, the body coil has a body coil conductor management 100 and a tuning/detuning circuit 200.

The body coil conductor management 100 has two end rings 110 and multiple uniformly distributed antenna rods 120 connected between the two end rings 110, as well as multiple frequency tuning capacitors 130 disposed on the end rings and/or the antenna rods. Different body coils may have different numbers of antenna rods 120, e.g. 16, 12, 8 or another number; no limitation is placed thereon in embodiments of the present invention. For convenience of description, the case where 16 antenna rods are included is sometimes taken as an example in the embodiments presented herein. In addition, although the case of the high-pass body coil shown in FIG. 1 is taken as an example in the drawings in the embodiments presented herein, the technical solution of the present invention is not limited to a high-pass body coil, but may also be a low-pass body coil or a band-pass body coil. In order to make the components clearer in the drawings, not all of the antenna rods 120 have been drawn in the body coil conductor management 100 in the embodiments presented herein, and the antenna rods 120 have not been drawn in a uniformly distributed manner; only a few antenna rods 120 have been shown schematically, with a number of the rods being omitted. Thus, the total number of antenna rods 120 in the body coil conductor management 100 cannot be deduced on the basis of the spacing between the antenna rods 120 in the drawings (likewise below).

The tuning/detuning circuit 200 is connected to the body coil conductor management 100, and used to subject the body coil conductor management 100 to tuning/detuning control, on the basis of a control signal.

The tuning/detuning circuit 200 has the same number of multiple control signal interfaces 210, multiple switch diode units 220 and multiple AC/DC conversion circuits 230. Each combination of one control signal interface 210, one switch diode unit 220 and one AC/DC conversion circuit 230 forms one tuning/detuning sub-circuit 201 of the tuning/detuning circuit 200. In other words, the tuning/detuning circuit 200 comprises multiple tuning/detuning sub-circuits 201, each tuning/detuning sub-circuit 201 having one control signal interface 210, one switch diode unit 220 and one AC/DC conversion circuit 230. To make the drawings clearer, in embodiment 1 and embodiment 2 herein, the internal structure of only one tuning/detuning sub-circuit 201 is shown, but is the same as the internal structure of the other tuning/detuning sub-circuits 201. In actual application, the tuning/detuning sub-circuits 201 may only be series-connected on the antenna rods, or may only be series-connected on the end rings, or at least one tuning/detuning sub-circuit 201 may be series-connected on an antenna rod while at least one tuning/detuning sub-circuit is series-connected on an end ring at the same time. In the case where the tuning/detuning sub-circuit 201 is series-connected on an antenna rod, it is not necessary for one tuning/detuning sub-circuit 201 to be series-connected on each antenna rod. In other words, it is possible for one tuning/detuning sub-circuit 201 to be series-connected on each of only a set number of antenna rods. Of course, the tuning/detuning circuit 200 may also comprise only one tuning/detuning sub-circuit 201, with the tuning/detuning sub-circuit 201 disposed on a particular antenna rod or on a particular end ring. In this embodiment, the case where one tuning/detuning sub-circuit 201 is disposed on each antenna rod 120 is taken as an example for the purpose of description.

In each tuning/detuning sub-circuit 201, the control signal interface 210 is used to receive the control signal; the control signal comprises a DC current signal and a DC voltage signal which alternate with each other. In this embodiment, the DC current signal may be 10 mA, 9 mA or 11 mA, etc.; in the case where the AC/DC conversion circuit 230 is realized by way of a rectifying diode, the DC voltage signal may be 0 V, −0.5 V or −0.65 V, or in the case where the AC/DC conversion circuit 230 is realized by way of two series-connected rectifying diodes, the DC voltage signal may be −1 V or −1.35 V, etc. In other words, the DC voltage signal may have different values depending on the particular way in which the AC/DC conversion circuit 230 is realized, but must result in the rectifying circuit of the AC/DC conversion circuit 230 being unable to turn on. When the DC voltage signal is 0 V, this corresponds to there being no voltage signal.

Each switch diode unit 220 may be respectively series-connected on an antenna rod 120 of the body coil conductor management 100. Corresponding to the tuning/detuning sub-circuit 201, in other embodiments, the switch diode unit 220 is also series-connected on the end ring 110. Alternatively, it is also possible for a portion to be respectively series-connected on the antenna rods 120, with a portion being series-connected on the end ring 110; multiple specific connection arrangements are possible. In this embodiment, for convenience of description, the case where the switch diode units are only series-connected on the antenna rods 120 is taken as an example for the purpose of description. In the embodiments presented herein, each switch diode unit 220 may be formed of at least one switch diode connected in series and/or in parallel, but to make the description simpler, in all of the embodiments presented herein, the case where each switch diode unit 220 is one switch diode D1 is taken as an example for the purpose of description, and in order to distinguish them from ordinary diodes, the switch diodes herein are all described taking the case of PIN diodes as an example. When the switch diode unit 220 is turned on, the body coil conductor management 100 is tuned; when the switch diode unit 220 is turned off, the body coil conductor management 100 is detuned.

Each AC/DC conversion circuit 230 has a rectifying circuit 231, for converting the power of an input RF emission signal in the MRI system to a DC current, the DC current being used to provide a DC current for the switch diode unit 220 to be turned on. To make the description simpler, in all of the embodiments presented herein, the case where the rectifying circuit 231 has one rectifying diode D2 is taken as an example for the purpose of description.

The DC current signal of the control signal and the DC current of the AC/DC conversion circuit 230 turn on the switch diode unit 220; or the DC voltage signal of the control signal turns off the switch diode unit 220.

As FIGS. 2A and 2B show, each AC/DC conversion circuit 230 in embodiment 1 also has a first shunt inductor L1 which is connected in series with the rectifying circuit 231. Correspondingly, the tuning/detuning circuit 200 also further comprises multiple second shunt inductors L2 corresponding to the number of switch diode units, each second shunt inductor L2 being connected in series with one switch diode unit 220, on the antenna rod 120 where the switch diode unit 220 is located, to form a switch unit 240 on the antenna rod 120. In other words, each tuning/detuning sub-circuit 201 also comprises a second shunt inductor L2 which is connected in series with the switch diode unit 220 on the antenna rod 120, to form the switch unit 240 on the antenna rod 120.

Two ends of each AC/DC conversion circuit 230 are connected to two ends of one switch unit 240, respectively. That is, in each tuning/detuning sub-circuit 201, the AC/DC conversion circuit 230 is connected in parallel with the switch unit 240 and in turn connected to ground via an RF choke inductor L3.

The first shunt inductor L1 and second shunt inductor L2 are used to shunt the input RF emission signal in the MRI system, on the switch diode unit 220 and rectifying circuit 231. By adjusting the inductance coefficient of the first shunt inductor L1 and second shunt inductor L2, the current component used to generate DC in the AC/DC conversion circuit 230 can be adjusted. The larger the input RF emission signal, the larger the DC generated, therefore the shunt inductor can avoid the problem of the switch diode generating heat caused by an unnecessary large DC current when the signal is small.

The control signal interface 210 may be connected to the positive terminal of the switch diode unit 220, or may be connected to the second shunt inductor L2.

When the MRI system requires the body coil conductor management 100 to be tuned, the MRI system provides a DC current signal as a control signal, at which time the switch diode unit 220 is turned on, and the current flowing through the switch diode unit 220 is merely the DC current signal; when the body coil conductor management 100 emits an RF signal, the first shunt inductor L1 in the AC/DC conversion circuit 230 and the second shunt inductor L2 in the tuning/detuning circuit shunt the input RF emission signal, then the input RF emission signal which flows through the rectifying circuit 231 in the AC/DC conversion circuit 230 is rectified into DC and provided as an output to the positive terminal of the switch diode unit 220. At this time, the current flowing through the switch diode unit 220 is the DC current signal plus the DC current supplied by the AC/DC conversion circuit 230.

When the MRI system requires the body coil conductor management 100 to be detuned, the MRI system provides a DC voltage signal as a control signal, at which time the switch diode unit 220 is turned off.

In embodiment 1, as FIG. 2B shows, the control signal interfaces 210 of the tuning/detuning sub-circuits 201 may also be connected in parallel, each via an RF choke inductor L41, L42, L43, . . . respectively, before being connected to a general control signal interface 210, for receiving a general control signal; the DC voltage signal of the general control signal is the same as the DC voltage signal of a single tuning/detuning sub-circuit 201 before parallel connection, e.g. 0 V, −0.5 V or −1 V, etc., as before. However, the DC current signal of the general control signal is the sum of the DC current signals of the single tuning/detuning sub-circuits 201 before parallel connection; for instance, if the body coil has 16 antenna rods, with one tuning/detuning sub-circuit 201 series-connected on each antenna rod, then the total DC current signal is 160 mA, 144 mA or 176 mA, etc. In FIG. 2B, the case where 16 tuning/detuning sub-circuits 201 are included is taken as an example, with the subscripts 1, 2, . . . , 16 being used for the components of each tuning/detuning sub-circuit 201 respectively, to indicate the number of the particular tuning/detuning sub-circuit 201 in question.

Embodiment 2

Figure 3:
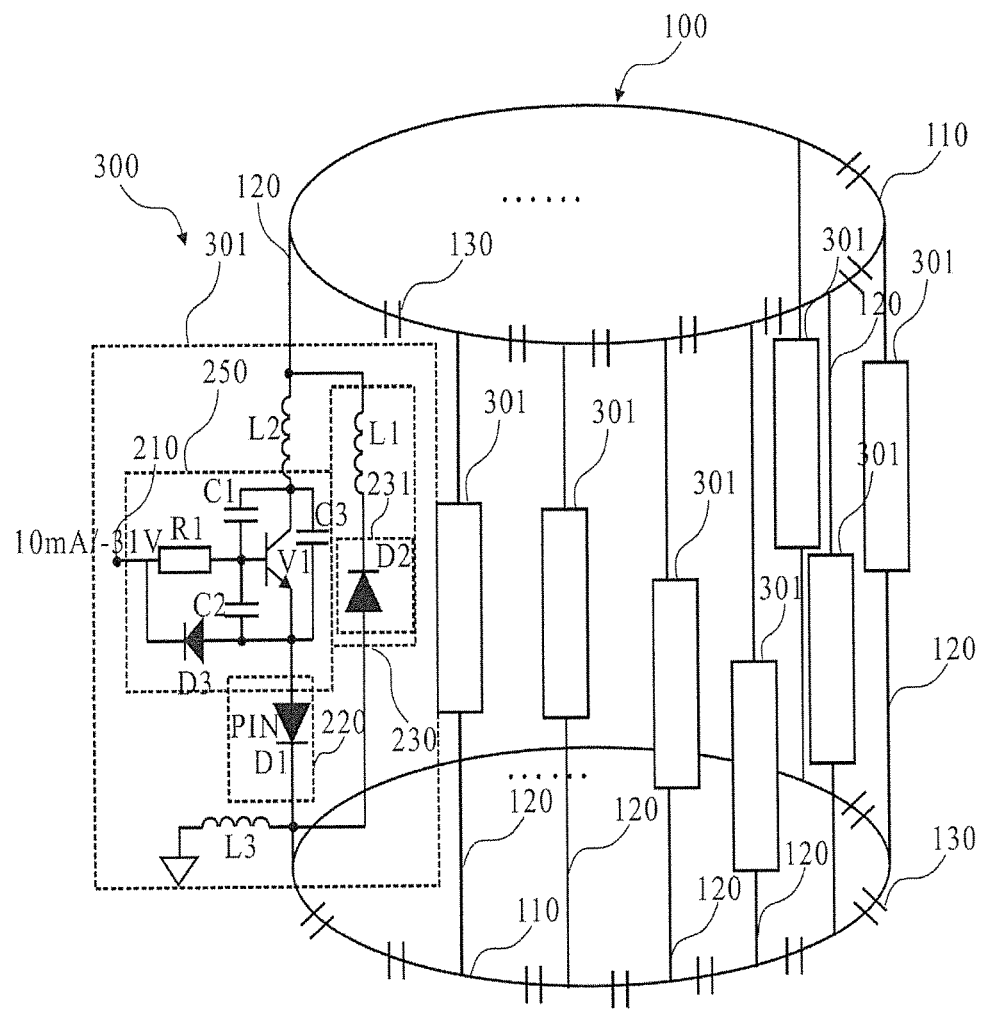
FIG. 3 is a schematic illustration of a body coil in a second embodiment of the present invention.

FIG. 3 is a structural schematic diagram of a body coil in embodiment 2 of the present invention. As FIG. 3 shows, the body coil comprises: a body coil conductor management 100 and a tuning/detuning circuit 300.

The body coil conductor management 100 has two end rings 110 and multiple uniformly distributed antenna rods 120 connected between the two end rings 110, as well as multiple frequency tuning capacitors 130 disposed on the end rings and/or the antenna rods. Different body coils may have different numbers of antenna rods 120, e.g. 16, 12, 8 or another number; no limitation is placed thereon in embodiments of the present invention. In addition, the body coil is not limited to a high-pass body coil, but may also be a low-pass body coil or a band-pass body coil.

The tuning/detuning circuit 300 is connected to the body coil conductor management 100, and used to subject the body coil conductor management 100 to tuning/detuning control, on the basis of a control signal.

The tuning/detuning circuit 300 has the same number of multiple control signal interfaces 210, multiple control circuits 250, multiple switch diode units 220 and multiple AC/DC conversion circuits 230. Each combination of one control signal interface 210, one control circuit 250, one switch diode unit 220 and one AC/DC conversion circuit 230 forms one tuning/detuning sub-circuit 301 of the tuning/detuning circuit 300. In other words, the tuning/detuning circuit 300 has multiple tuning/detuning sub-circuits 301, each tuning/detuning sub-circuit 301 having one control signal interface 210, one control circuit 250, one switch diode unit 220 and one AC/DC conversion circuit 230. In this embodiment, the case where one tuning/detuning sub-circuit 201 is disposed on each antenna rod 120 is again taken as an example for the purpose of description. Of course, the tuning/detuning circuit 200 may also have only one tuning/detuning sub-circuit 201, with the tuning/detuning sub-circuit 201 disposed on a particular antenna rod or on a particular end ring. Alternatively, two or more tuning/detuning sub-circuits 201 are included; these tuning/detuning sub-circuits 201 may only be series-connected on the antenna rods, or may only be series-connected on the end rings, or at least one tuning/detuning sub-circuit 201 may be series-connected on an antenna rod while at least one tuning/detuning sub-circuit is series-connected on an end ring at the same time.

In each tuning/detuning sub-circuit 301, the control signal interface 210 is used to receive the control signal; the control signal comprises a DC current signal and a DC voltage signal which alternate with each other. The DC current signal in this embodiment may be 10 mA, 9 mA or 11 mA, etc.; the DC voltage signal may be a negative voltage signal which causes the rectifying circuit of the AC/DC conversion circuit 230 to be unable to turn on, such as −31 V or −30 V, etc.

Each control circuit 250 is connected in series with one switch diode unit 220 or connected in series with the rectifying circuit of one AC/DC conversion circuit 230; and is used for ensuring that the AC/DC conversion circuit 230 does not operate, and the switch diode unit 220 is turned off, when the control signal is a DC voltage signal. For example, it causes the rectifying circuit of the AC/DC conversion circuit 230 to be turned off. More than one form of structural implementation of the control circuit 250 is possible. For instance, it may be realized as a MOSFET, or as a bipolar junction transistor. When it is realized by way of a bipolar junction transistor, the control circuit 250 may comprise a bipolar junction transistor connected in series with the switch diode unit 220 or with the rectifying circuit of the AC/DC conversion circuit 230, and a bypass diode connected between the base and collector, or the base and emitter, of the bipolar junction transistor; and at least two AC passthrough capacitors connected in parallel between the various pins of the bipolar junction transistor.

In this embodiment, the case where the control circuit 250 is connected in series with the switch diode unit 220 is taken as an example. In this embodiment, the control circuit 250 may comprise a bipolar junction transistor V1, a bypass diode D3 connected between the base and emitter of the bipolar junction transistor V1, and AC passthrough capacitors C1, C2 and C3 connected in parallel between the various pins of the bipolar junction transistor V1.

In this embodiment, the bipolar junction transistor V1 and switch diode unit 220 are connected in series of the antenna rod 120 of the body coil conductor management 100. The bypass diode D3 has its negative terminal connected to the base of the bipolar junction transistor V1 and its positive terminal connected to the emitter of the bipolar junction transistor V1. The base of the bipolar junction transistor V1 is connected to the control signal interface 210; the DC current signal of the control signal turns on the bipolar junction transistor, and at the same time the DC current signal of the control signal and the DC current of the AC/DC conversion circuit 230 turn on the switch diode unit 220. Alternatively, the DC voltage signal of the control signal is led to the positive terminal of the switch diode unit 220 directly via the bypass diode D3, so that the switch diode unit 220 is turned off; at the same time the DC voltage signal causes the bipolar junction transistor V1 to be turned off, and thereby causes the rectifying circuit of the AC/DC conversion circuit 230 to be turned off. When the switch diode unit 220 is turned on, the body coil conductor management 100 is tuned; when the switch diode unit 220 is turned off, the body coil conductor management 100 is detuned.

The AC passthrough capacitors C1, C2 and C3 are used for leading the input RF emission signal from the body coil conductor management 100 to the switch diode unit 220 which is turned on, so as not to affect the operation of the body coil conductor management 100.

Each AC/DC conversion circuit 230 has a rectifying circuit 231 and a first shunt inductor L1, for converting the power of an input RF emission signal in the MRI system to a DC current, the DC current being used to provide a DC current for the switch diode unit 220 to be turned on. The tuning/detuning circuit 300 also has multiple second shunt inductors L2 corresponding to the number of switch diode units, each second shunt inductor L2 being connected in series with one series-connected bipolar junction transistor V1 and switch diode unit 220, on the antenna rod 120 where the switch diode unit 220 is located. In other words, each tuning/detuning sub-circuit 301 also has a second shunt inductor L2 that is connected in series with the bipolar junction transistor V1 and the switch diode unit 220 on the antenna rod 120. In this embodiment, the collector of the bipolar junction transistor V1 is connected to the second shunt inductor L2; the emitter of the bipolar junction transistor V1 is connected to the positive terminal of the switch diode unit 220. The second shunt inductor L2, bipolar junction transistor V1 and switch diode unit 220 together form a switch unit on the antenna rod 120.

Two ends of each AC/DC conversion circuit 230 are connected to two ends of one switch unit, respectively. That is, in each tuning/detuning sub-circuit 301, the AC/DC conversion circuit 230 is connected in parallel with the switch unit and in turn connected to ground via an RF choke inductor L3.

The first shunt inductor L1 and second shunt inductor L2 are used to shunt the input RF emission signal in the MRI system, on the switch diode unit 220 and rectifying circuit 231. By adjusting the inductance coefficient of the first shunt inductor L1 and second shunt inductor L2, the current component used to generate DC in the AC/DC conversion circuit 230 can be adjusted. The larger the input RF emission signal, the larger the DC generated, and the shunt inductor can avoid the problem of the switch diode generating heat caused by an unnecessary large DC current when the signal is small.

In addition, in embodiment 2, the tuning/detuning circuit 300 further comprises multiple current-limiting resistors R1 corresponding to the number of switch diode units, with each current-limiting resistor R1 being connected between the corresponding control signal interface 210 and bipolar junction transistor V1, and being used to protect the bipolar junction transistor V1, by preventing an excessively large current from burning the bipolar junction transistor V1, so that the circuit operates more stably. Of course, in some applications, there may be no current-limiting resistor R1.

In embodiment 2, when the MRI system requires the body coil conductor management 100 to be tuned, the MRI system provides a DC current signal as a control signal, at which time the bipolar junction transistor V1 is turned on, and at this time the body coil conductor management 100 emits an RF signal, the first shunt inductor L1 in the AC/DC conversion circuit 230 and the second shunt inductor L2 in the tuning/detuning circuit shunt the input RF emission signal, then the input RF emission signal which flows through the rectifying circuit 231 in the AC/DC conversion circuit 230 is rectified into DC current; this DC current is provided as an output to the emitter via the collector of the bipolar junction transistor V1, and in turn provided as an output to the positive terminal of the switch diode unit 220, causing the switch diode unit 220 to be turned on.

When the MRI system requires the body coil conductor management 100 to be detuned, the MRI system provides a DC voltage signal as a control signal, at which time the DC voltage signal is led directly to the positive terminal of the switch diode unit 220 via the bypass diode D3; the bipolar junction transistor V1 is turned off, and at the same time the body coil conductor management 100 does not emit an RF signal, so the AC/DC conversion circuit 230 cannot output a DC current, therefore the switch diode unit 220 is turned off.

In embodiment 2, the control signal interfaces 210 of the tuning/detuning sub-circuits 301 may also be connected in parallel before being connected to a general control signal interface (not shown in the figure), for receiving a general control signal; the DC voltage signal of the general control signal is the same as the DC voltage signal of a single tuning/detuning sub-circuit 301 before parallel connection, e.g. −31 V or −30 V, etc., as before. However, the DC current signal of the general control signal is the sum of the DC current signals of the single tuning/detuning sub-circuits 301 before parallel connection; for instance, if the body coil has 16 antenna rods, with one tuning/detuning sub-circuit 201 series-connected on each antenna rod, then the total DC current signal is 160 mA, 144 mA or 176 mA, etc.

In the two embodiments above, one tuning/detuning sub-circuit is provided to correspond to each antenna rod respectively, and each tuning/detuning sub-circuit has the same structure and connection relationship. In the present application, in order to further reduce the cost of the tuning/detuning circuit, and reduce the number of tuning/detuning components, consideration is given to the possibility of using just one control signal interface 210 and one AC/DC conversion circuit 230, and connecting in parallel multiple switch diode units 220 located on antenna rods, in order to realize the function of the tuning/detuning circuit described above. This is described below by way of two embodiments.

Embodiment 3

Figure 4:
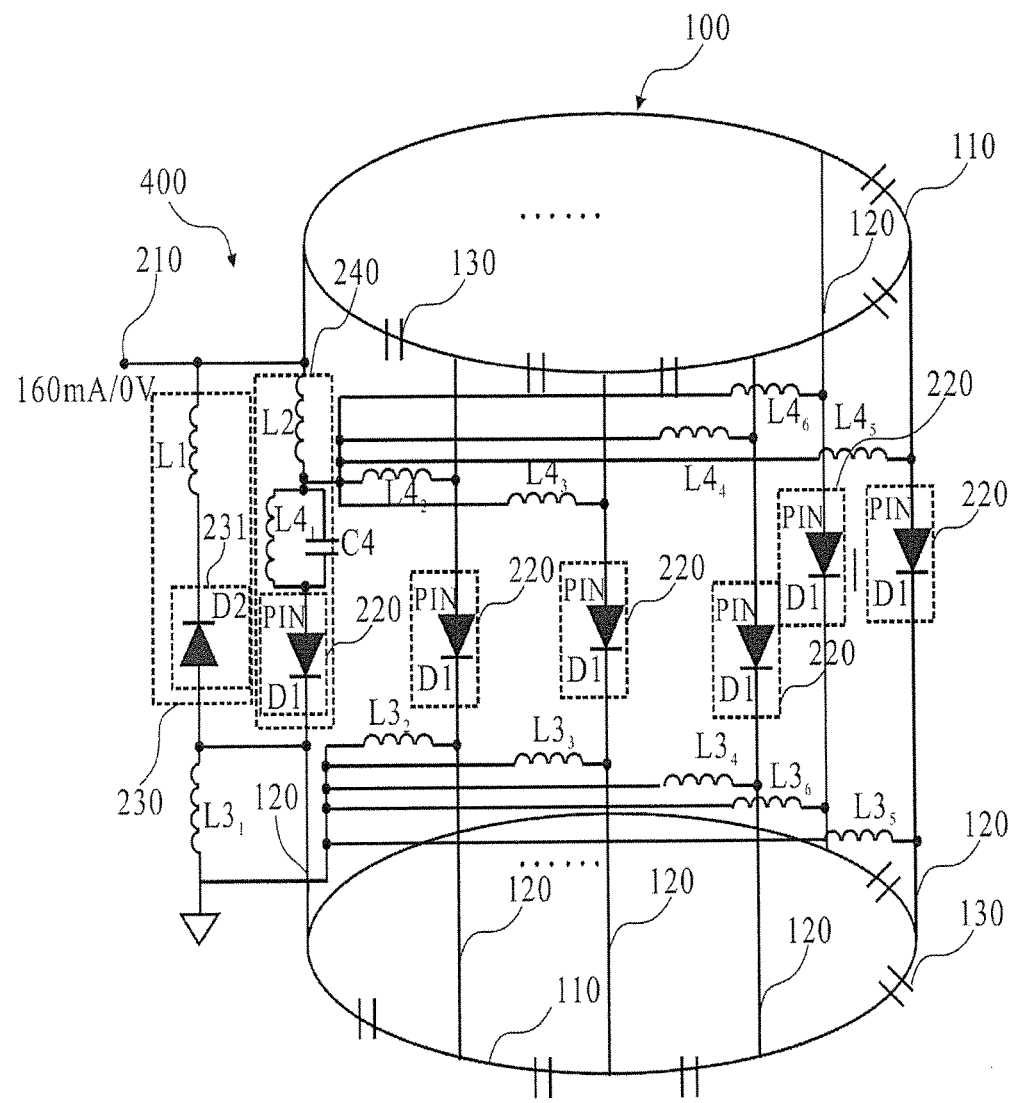
FIG. 4 is a schematic illustration of a body coil in a third embodiment of the present invention.

FIG. 4 is a structural schematic diagram of a body coil in embodiment 3 of the present invention. As FIG. 4 shows, the body coil has a body coil conductor management 100 and a tuning/detuning circuit 400.

The body coil conductor management 100 has two end rings 110 and multiple uniformly distributed antenna rods 120 connected between the two end rings 110, as well as multiple frequency tuning capacitors 130 disposed on the end rings and/or the antenna rods. Different body coils may have different numbers of antenna rods 120, e.g. 16, 12, 8 or another number; no limitation is placed thereon in embodiments of the present invention. However, for convenience of description, the case of 16 rods is taken as an example in embodiment 3 for the purpose of description. In addition, the body coil is not limited to a high-pass body coil, but may also be a low-pass body coil or a band-pass body coil.

The tuning/detuning circuit 400 is connected to the body coil conductor management 100, and used to subject the body coil conductor management 100 to tuning/detuning control, on the basis of a control signal.

The tuning/detuning circuit 400 has one control signal interface 210, multiple switch diode units 220 and one AC/DC conversion circuit 230.

The control signal interface 210 is used to receive the control signal; the control signal has a DC current signal and a DC voltage signal that alternate with each other. In embodiment 3, in consideration of the fact that the switch diode units 220 are connected in parallel before being connected to one control signal interface 210, the DC current signal may be 160 mA, 144 mA or 176 mA, etc., and the DC voltage signal, as before, may be a negative voltage signal which causes the rectifying circuit of the AC/DC conversion circuit 230 to be unable to turn on, such as 0 V, −0.5 V or −1 V.

Each switch diode unit 220 is series-connected on an antenna rod 120 of the body coil conductor management 100. In other embodiments, the switch diode unit 220 may also be series-connected on the end ring 110. Alternatively, it is also possible for a portion to be respectively series-connected on the antenna rods 120, with a portion being series-connected on the end ring 110; multiple specific connection arrangements are possible. In this embodiment, for convenience of description, the case where each switch diode unit 220 is series-connected on one antenna rod 120 of the body coil conductor management 100 is taken as an example for the purpose of description. In the embodiments presented herein, each switch diode unit 220 may be formed of at least one switch diode connected in series and/or in parallel, but to make the description simpler, in all of the embodiments presented herein, the case where each switch diode unit 220 is one switch diode D1 is taken as an example for the purpose of description, and in order to distinguish them from ordinary diodes, the switch diodes herein are all described taking the case of PIN diodes as an example. When the switch diode unit 220 is turned on, the body coil conductor management 100 is tuned; when the switch diode unit 220 is turned off, the body coil conductor management 100 is detuned.

The AC/DC conversion circuit 230 is connected in parallel with any one switch diode unit 220 (D11); the remaining switch diode units D12, D13, . . . and the switch diode unit 220 connected to the AC/DC conversion circuit 230 are connected in parallel, each via an RF choke inductor L51, L52, L53, . . . respectively, and are likewise each connected to ground via an RF choke inductor L31, L32, L33, . . . respectively. Correspondingly, the tuning/detuning circuit 400 further has an AC passthrough capacitor C4, which is connected in parallel with the RF choke inductor L51 and used to lead the input RF emission signal from the body coil conductor management 100 to the switch diode unit 220 which is turned on, so as not to affect the operation of the body coil conductor management 100.

Likewise, in embodiment 3, the AC/DC conversion circuit 230 has a rectifying circuit 231 (D2) and a first shunt inductor L1, for converting the power of an input RF emission signal in the MRI system to a DC current, the DC current being used to provide a DC current for each switch diode unit 220 to be turned on.

The tuning/detuning circuit 400 also has a second shunt inductor L2; the second shunt inductor L2 is connected on the antenna rod, in series with the switch diode unit 220 connected to the AC/DC conversion circuit 230, to form a switch unit 240 on the antenna rod. Two ends of the AC/DC conversion circuit 230 are connected to two ends of the switch unit 240, respectively.

The first shunt inductor L1 and second shunt inductor L2 are used to shunt the input RF emission signal in the MRI system, on the switch diode unit 220 and the rectifying circuit 231.

Embodiment 4

Figure 5:
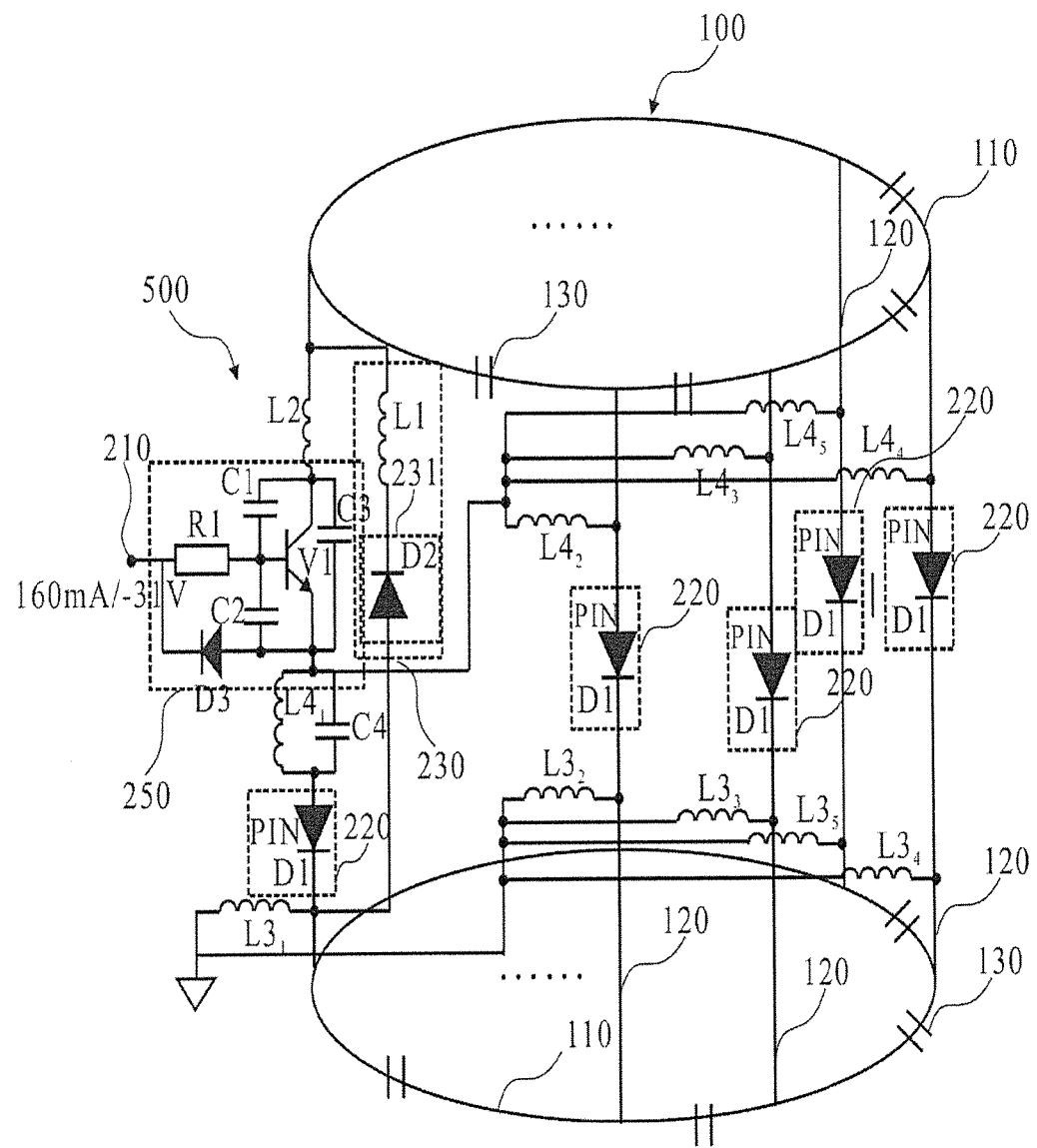
FIG. 5 is a schematic illustration of a body coil in a fourth embodiment of the present invention.

FIG. 5 is a structural schematic diagram of a body coil in embodiment 2 of the present invention. As FIG. 5 shows, the body coil has a body coil conductor management 100 and a tuning/detuning circuit 500.

The body coil conductor management 100 has two end rings 110 and multiple uniformly distributed antenna rods 120 connected between the two end rings 110, as well as multiple frequency tuning capacitors 130 disposed on the end rings and/or the antenna rods. Different body coils may have different numbers of antenna rods 120, e.g. 16, 12, 8 or another number; no limitation is placed thereon in embodiments of the present invention. However, for convenience of description, the case of 16 antenna rods is taken as an example in embodiment 4 for the purpose of description. In addition, the body coil is not limited to a high-pass body coil, but may also be a low-pass body coil or a band-pass body coil.

The tuning/detuning circuit 500 is connected to the body coil conductor management 100, and used to subject the body coil conductor management 100 to tuning/detuning control, on the basis of a control signal.

The tuning/detuning circuit 500 has one control signal interface 210, multiple switch diode units 220, one control circuit 250 and one AC/DC conversion circuit 230.

The control signal interface 210 is used to receive the control signal; the control signal has a DC current signal and a DC voltage signal that alternate with each other. In embodiment 4, in consideration of the fact that the switch diode units 220 are connected in parallel before being connected to one control signal interface 210, the DC current signal may be 160 mA, 144 mA or 176 mA, etc., and the DC voltage signal may as before be a negative voltage signal which causes the rectifying process of the AC/DC conversion circuit 230 to be unable to turn on, such as −30 V or −31 V.

Each switch diode unit 220 is series-connected on an antenna rod 120 of the body coil conductor management 100. In other embodiments, the switch diode unit 220 may also be series-connected on the end ring 110. Alternatively, it is also possible for a portion to be respectively series-connected on the antenna rods 120, with a portion being series-connected on the end ring 110; multiple specific connection arrangements are possible. In this embodiment, for convenience of description, the case where each switch diode unit 220 is series-connected on one antenna rod 120 of the body coil conductor management 100 is taken as an example for the purpose of description. In the embodiments presented herein, each switch diode unit 220 may be formed of at least one switch diode connected in series and/or in parallel, but to make the description simpler, in all of the embodiments presented herein, the case where each switch diode unit 220 is one switch diode D1 is taken as an example for the purpose of description, and in order to distinguish them from ordinary diodes, the switch diodes herein are all described taking the case of PIN diodes as an example. When the switch diode unit 220 is turned on, the body coil conductor management 100 is tuned; when the switch diode unit 220 is turned off, the body coil conductor management 100 is detuned.

The AC/DC conversion circuit 230 is connected in parallel with any switch diode unit 220; the remaining switch diode units D12, D13, . . . and the switch diode unit 220 connected to the AC/DC conversion circuit 230 are connected in parallel, each via an RF choke inductor L51, L52, L53, . . . respectively, and are likewise each connected to ground via an RF choke inductor L31, L32, L33, . . . respectively.

The AC/DC conversion circuit 230 has a rectifying circuit 231 (D2) and a first shunt inductor L1, for converting the power of an input RF emission signal in the MRI system to a DC current, the DC current being used to provide a DC current for each switch diode unit 220 to be turned on. At the same time, the tuning/detuning circuit 500 also has a second shunt inductor L2; the second shunt inductor L2 is connected on the antenna rod, in series with the switch diode unit 220 connected to the AC/DC conversion circuit 230.

The control circuit 250 is connected in series with the switch diode unit 220 or connected in series with the rectifying circuit 231; and is used for ensuring that the AC/DC conversion circuit 230 does not operate, and the switch diode unit 220 is turned off, when the control signal is a DC voltage signal. More than one form of structural implementation of the control circuit 250 is possible. For instance, it may be realized by way of a MOSFET, or by way of a bipolar junction transistor. When it is realized as a bipolar junction transistor, the control circuit 250 may has a bipolar junction transistor connected in series with the switch diode unit 220 or with the rectifying circuit 231, and a bypass diode connected between the base and collector, or the base and emitter, of the bipolar junction transistor; and at least two AC passthrough capacitors connected in parallel between the various pins of the bipolar junction transistor.

In this embodiment, the case where the control circuit 250 is connected in series with the switch diode unit 220 is taken as an example. In this embodiment, the control circuit 250 may have a bipolar junction transistor V1, a bypass diode D3 connected between the base and emitter of the bipolar junction transistor V1, and AC passthrough capacitors C1, C2 and C3 connected in parallel between the various pins of the bipolar junction transistor V1.

In this embodiment, the bipolar junction transistor V1 is series-connected between the second shunt inductor L2 and the switch diode unit 220; the bypass diode D3 has its negative terminal connected to the base of the bipolar junction transistor V1 and its positive terminal connected to the emitter of the bipolar junction transistor V1. The base of the bipolar junction transistor V1 is connected to the control signal interface 210. In this embodiment, the collector of the bipolar junction transistor V1 is connected to the second shunt inductor L2, while the emitter is connected to the positive terminal of the switch diode unit 220 connected to the AC/DC conversion circuit 230. The second shunt inductor L2, bipolar junction transistor V1 and switch diode unit 220 together form a switch unit on the antenna rod 120. Two ends of the AC/DC conversion circuit 230 are connected to two ends of the switch unit, respectively.

In embodiment 4, when the control signal interface 210 receives a control signal of a DC voltage signal, the bypass diode D3 is used to lead the DC voltage signal to the positive terminal of the switch diode unit 220 directly, so that the switch diode unit 220 is turned off; at the same time the DC voltage signal causes the bipolar junction transistor V1 to be turned off, and thereby causes the rectifying circuit of the AC/DC conversion circuit 230 to be turned off. The AC passthrough capacitors C1, C2 and C3 are used for leading the input RF emission signal from the body coil conductor management 100 to the switch diode unit 220 which is turned on, so as not to affect the operation of the body coil conductor management 100.

In addition, in embodiment 4, the tuning/detuning circuit 500 further has a current-limiting resistor R1, with each current-limiting resistor R1 being connected between the corresponding control signal interface 210 and bipolar junction transistor V1, and being used to protect the bipolar junction transistor V1, by preventing an excessively large current from burning the bipolar junction transistor V1, so that the circuit operates more stably. Of course, in some applications, there may be no current-limiting resistor R1.

A body coil of an MRI system provided in various embodiments of the present invention has a body coil conductor management and a tuning/detuning circuit;

wherein the body coil conductor management has two end rings, multiple uniformly distributed antenna rods connected between the two end rings, and multiple frequency tuning capacitors disposed on the end rings and/or the antenna rods. The tuning/detuning circuit is connected to the body coil conductor management, and used to subject the body coil conductor management to switch control. The tuning/detuning circuit has a control signal interface, a switch diode unit and an AC/DC conversion circuit. The control signal interface is used to receive the control signal. The control signal comprises a DC current signal and a DC voltage signal (which in some embodiments may also be a DC voltage signal of 0 V) that alternate with one another. There is at least one such switch diode unit, for the purpose of series-connecting one switch diode unit on each antenna rod of the body coil conductor management, each switch diode unit being formed of at least one switch diode connected in series. When the switch diode unit is turned on, the body coil conductor management is tuned; when the switch diode unit is turned off, the body coil conductor management is detuned. The AC/DC conversion circuit has a rectifying circuit, for converting the power of an input RF emission signal in the MRI system to a DC current, the DC current being used to provide a DC current for the switch diode unit to be turned on. The DC current signal of the control signal and the DC current of the AC/DC conversion circuit turn on the switch diode unit; or the DC voltage signal of the control signal turns off the switch diode unit.

The MRI system provided in embodiments of the present invention has a body coil realized by any of the embodiments described above.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A body coil for a magnetic resonance imaging apparatus, said body coil comprising:
    a conductor arrangement comprising two end rings and a plurality of antenna rods connected between said two end rings and uniformly distributed around respective circumferences of said two end rings;
    a tuning/detuning circuit connected to said conductor arrangement, said tuning/detuning circuit being configured to provide a control signal to said conductor arrangement from a control signal interface of the tuning/detuning circuit, said control circuit also comprising a number of switch diode units and an equal number of AC/DC conversion circuits that provide respective control signals to said control signal interface, with each of said switch diode units via control signals comprising a DC current signal that places a respective switch diode supplied within a conducting state;
    said at least one switch diode unit being series-connected on at least one antenna rod or on at least one end ring of said current arrangement, said at least one switch diode unit comprising at least one switch diode connected in series or in parallel;
    each AC/DC conversion circuit comprising a rectifying circuit that converts power of an input RF emission signal of said magnetic resonance imaging apparatus to a DC current that is then embodied in said DC current signal; and
    each AC/DC conversion circuit comprising a first shunt inductor connected in series with the rectifying circuit, and wherein said tuning/detuning circuit comprises at least one second inductor, equal in number to the number of switch diode units, each second shunt inductor being connected in series with one switch diode unit on an antenna rod or an end ring of the conductor arrangement, to form a switch unit on said antenna rod or end ring, and wherein two terminals of each AC/DC conversion circuit are connected respective to two terminals of one switch unit, and wherein said first shunt inductor and said second shunt inductor shunt said input RF emission signal on said switch diode unit and said rectifying circuit.

2. A body coil as claimed in claim 1 comprising a number of said AC/DC conversion circuits that is equal to a number of said switch diode unit, with each AC/DC conversion circuit providing a DC current for one switch diode unit to be placed in said conducting state.

3. A body coil as claimed in claim 1 wherein said control signal interface is connected to a positive terminal of each switch diode unit, or is connected to the second shunt inductor.

4. A body coil as claimed in claim 1 wherein said tuning/detuning circuit comprises at least one control circuit corresponding in number to the number of switch diode units, each control circuit being connected in series with one switch diode unit, or connected in series with one rectifying circuit, and wherein said control signal also comprises a DC voltage signal, and wherein the control circuit places the rectifying circuit and the switch diode unit in the non-conducting state when said control signal is a DC voltage signal.

5. A body coil as claimed in claim 4 wherein said control circuit comprises a bipolar junction transistor connected in series with the switch diode unit or with the rectifying circuit, and a bypass diode connected between a base and a collector, or between a base and an emitter, of the bipolar junction transistor, and comprising at least to AC passthrough capacitors connected in parallel between respective terminals of the bipolar junction transistor.

6. A body coil as claimed in claim 1 comprising exactly one AC/DC conversion circuit, connected in parallel with any one switch diode unit, with any remaining switch diode units, and the switch diode unit connected to the AC/DC conversion circuit, being connected in parallel, each via an RF choke inductor.

7. A body coil as claimed in claim 6 wherein said control signal interface is connected to a positive terminal of each switch diode unit, or is connected to the second shunt inductor.

8. A body coil as claimed in claim 6 wherein said control circuit comprises a bipolar junction transistor connected in series with the switch diode unit or with the rectifying circuit, and a bypass diode connected between a base and a collector, or between a base and an emitter, of the bipolar junction transistor, and comprising at least to AC passthrough capacitors connected in parallel between respective terminals of the bipolar junction transistor.

9. A magnetic resonance imaging apparatus comprising:
    a data acquisition scanner comprising a body coil;
    said body coil comprising a conductor arrangement comprising two end rings and a plurality of antenna rods connected between said two end rings and uniformly distributed around respective circumferences of said two end rings;
    said body coil further comprising a tuning/detuning circuit connected to said conductor arrangement, said tuning/detuning circuit being configured to provide a control signal to said conductor arrangement from a control signal interface of the tuning/detuning circuit, said control circuit also comprising a number of switch diode units and an equal number of AC/DC conversion circuits that provide respective control signals to said control signal interface, with each of said switch diode units via control signals comprising a DC current signal that places a respective switch diode supplied within a conducting state;

said at least one switch diode unit being series-connected on at least one antenna rod or on at least one end ring of said current arrangement, said at least one switch diode unit comprising at least one switch diode connected in series or in parallel;

each AC/DC conversion circuit comprising a rectifying circuit that converts power of an input RF emission signal of said magnetic resonance imaging apparatus to a DC current that is then embodied in said DC current signal; and each AC/DC conversion circuit comprising a first shunt inductor connected in series with the rectifying circuit, and wherein said tuning/detuning circuit comprises at least one second inductor, equal in number to the number of switch diode units, each second shunt inductor being connected in series with one switch diode unit on an antenna rod or an end ring of the conductor arrangement, to form a switch unit on said antenna rod or end ring, and wherein two terminals of each AC/DC conversion circuit are connected respective to two terminals of one switch unit, and wherein said first shunt inductor and said second shunt inductor shunt said input RF emission signal on said switch diode unit and said rectifying circuit.

* * * * *